United States Patent
Kim et al.

(10) Patent No.: US 11,075,358 B2
(45) Date of Patent: Jul. 27, 2021

(54) DISPLAY APPARATUS AND MOBILE TERMINAL

(71) Applicant: Samsung Display Co., Ltd., Yongin-si (KR)

(72) Inventors: Sanghoon Kim, Hwaseong-si (KR); Seongjin Hwang, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 270 days.

(21) Appl. No.: 16/200,546

(22) Filed: Nov. 26, 2018

(65) Prior Publication Data
US 2019/0165314 A1    May 30, 2019

(30) Foreign Application Priority Data

Nov. 30, 2017   (KR) .................. 10-2017-0163549

(51) Int. Cl.
| | | |
|---|---|---|
| *H01L 51/52* | (2006.01) | |
| *H01L 51/00* | (2006.01) | |
| *H01L 27/32* | (2006.01) | |

(52) U.S. Cl.
CPC ...... *H01L 51/5253* (2013.01); *H01L 51/0097* (2013.01); *H01L 27/3244* (2013.01); *H01L 2251/5338* (2013.01); *H01L 2251/5369* (2013.01)

(58) Field of Classification Search
CPC .................. H01L 51/5253; H01L 51/0087
USPC ............................... 345/173; 349/15; 2/410
See application file for complete search history.

(56) References Cited

U.S. PATENT DOCUMENTS

| | | | |
|---|---|---|---|
| 9,519,370 B2 | 12/2016 | Nam et al. | |
| 9,886,116 B2 | 2/2018 | Parivar et al. | |
| 2012/0096630 A1* | 4/2012 | Ferguson | A41D 31/285 2/410 |
| 2014/0204293 A1* | 7/2014 | Kim | G02F 1/133351 349/15 |
| 2016/0009593 A1* | 1/2016 | Brychell | C03C 27/00 428/337 |
| 2016/0041679 A1* | 2/2016 | Ahn | H01L 51/0097 345/173 |
| 2016/0116814 A1* | 4/2016 | Teranishi | G02F 1/172 359/296 |
| 2017/0373121 A1* | 12/2017 | Leng | H01L 27/32 |
| 2018/0059727 A1* | 3/2018 | Seo | G06F 1/1656 |
| 2019/0187513 A1* | 6/2019 | Jin | G02F 1/13332 |
| 2019/0380217 A1* | 12/2019 | Cosgrove | H05K 5/0226 |

FOREIGN PATENT DOCUMENTS

| | | | | |
|---|---|---|---|---|
| KR | 10-1732488 B1 | 5/2017 | | |
| WO | WO-2008115636 | * | 9/2008 | ............ D01F 8/00 |

* cited by examiner

*Primary Examiner* — Prabodh M Dharia
(74) *Attorney, Agent, or Firm* — Lewis Roca Rothgerber Christie LLP (57) ABSTRACT

A display apparatus includes a display panel having a display region on which an image is displayed, a non-display region adjacent to the display region, a folding region configured to be folded along a folding axis and overlapping the display region, and a flat region adjacent to the folding region and extending in a direction perpendicular to the folding axis, and a protection film on a lower portion of the display panel and including a shear thickening fluid.

20 Claims, 9 Drawing Sheets

DISPLAY APPARATUS AND MOBILE TERMINAL

CROSS-REFERENCE TO RELATED APPLICATION

This application claims priority to and the benefit of Korean Patent Application No. 10-2017-0163549, filed on Nov. 30, 2017, the entire content of which is hereby incorporated by reference.

BACKGROUND

1. Field

Aspects of the present disclosure relates to an organic light emitting display apparatus.

2. Description of the Related Art

Electronic devices that display images, such as smart phones, digital cameras, laptop computers, navigation systems, and televisions, include display panels for displaying images. A mobile terminal such as a smart phone is carried by a user, thereby being more likely to be damaged than a mounted terminal such as a television.

Recently, flexible display devices have been developed. A flexible display device employs a flexible display panel. The shape of a flexible display panel may be changed by an external force. However, deformation thereof may occur due to a repetitive external force, and electronic elements disposed in a region where the deformation occurs may be deteriorated or cracked.

SUMMARY

Aspects of embodiments of the present disclosure are directed to a display apparatus and a mobile terminal capable of alleviating deformation, which may occur in a display panel as a result of folding, rolling, and stretching, and at the same time, capable of improving the impact resistance characteristic thereof.

According to some embodiments of the inventive concept, there is provided a display apparatus including: a display panel having a display region on which an image is displayed, a non-display region adjacent to the display region, a folding region configured to be folded along a folding axis and overlapping the display region, and a flat region adjacent to the folding region and extending in a direction perpendicular to the folding axis; and a protection film on a lower portion of the display panel and including a shear thickening fluid.

In some embodiments, the protection film further includes: a first film; a second film separated from the first film; and a sealing member configured to seal a gap between the first film and the second film to provide a sealed space therein, and wherein the shear thickening fluid is in the sealed space.

In some embodiments, the protection film further includes: a first film including a first central portion, and a first peripheral portion surrounding the first central portion; and a second film including a second central portion opposite from the first central portion, and a second peripheral portion surrounding the second central portion and opposite from the first peripheral portion, and wherein the first peripheral portion and the second peripheral portion are bonded to each other to provide a sealed space between the first central portion and the second central portion, and the shear thickening fluid is in the sealed space.

In some embodiments, the protection film further includes a fabric, and the shear thickening fluid is impregnated into the fabric.

In some embodiments, the protection film further includes: a first coating layer on an upper portion of the fabric into which the shear thickening fluid is impregnated; and a second coating layer on a lower portion of the fabric into which the shear thickening fluid is impregnated.

In some embodiments, the protection film further includes a base film having a void defined on a surface thereof, and the shear thickening fluid is in the void of the base film.

In some embodiments, the protection film further includes: a first coating layer on an upper portion of the base film; and a second coating layer on a lower portion of the base film.

In some embodiments, the display apparatus further includes an adhesive layer between the display panel and the protection film.

In some embodiments, the display panel is an organic light emitting display panel.

In some embodiments, the display apparatus further includes: a window on an upper portion of the display panel; and an adhesive layer between the window and the display panel.

In some embodiments, the protection film has a thickness of 300 μm or less.

According to some embodiments of the inventive concept, there is provided a display apparatus including: a flexible display panel having a display region on which an image is displayed, and a non-display region adjacent to the display region; and a protection film on a lower portion of the display panel and including a shear thickening fluid.

In some embodiments, the display panel is an organic light emitting display panel.

In some embodiments, the display apparatus further includes a housing configured to allow the display panel to be rolled along an outer periphery thereof, wherein the display panel is flexible.

In some embodiments, the display panel is stretchable.

According to some embodiments of the inventive concept, there is provided a mobile terminal including: a display panel having a display region on which an image is displayed, a non-display region adjacent to the display region, a folding region configured to be folded along a folding axis and overlapping the display region, and a flat region defined adjacent to the folding region in a direction perpendicular to the folding axis, the display region, the non-display region, the folding region and the flat region being defined on the display panel; and a protection film on a lower portion of the display panel and including a shear thickening fluid.

In some embodiments, the protection film further includes: a first film; a second film separated from the first film; and a sealing member configured to seal a gap between the first film and the second film to provide a sealed space therein, wherein the shear thickening fluid is in the sealed space.

In some embodiments, the protection film further includes: a first film including a first central portion, and a first peripheral portion surrounding the first central portion; and a second film including a second central portion opposite from the first central portion, and a second peripheral portion surrounding the second central portion and opposite from the first peripheral portion, and wherein the first peripheral portion and the second peripheral portion are bonded to each other to provide a sealed space between the first central portion and the second central portion, and the shear thickening fluid is in the sealed space.

In some embodiments, the protection film further includes a fabric, and the shear thickening fluid is impregnated into the fabric.

In some embodiments, the protection film further includes a base film having a void defined on a surface thereof, and the shear thickening fluid is in the void of the base film.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

Figure 1:
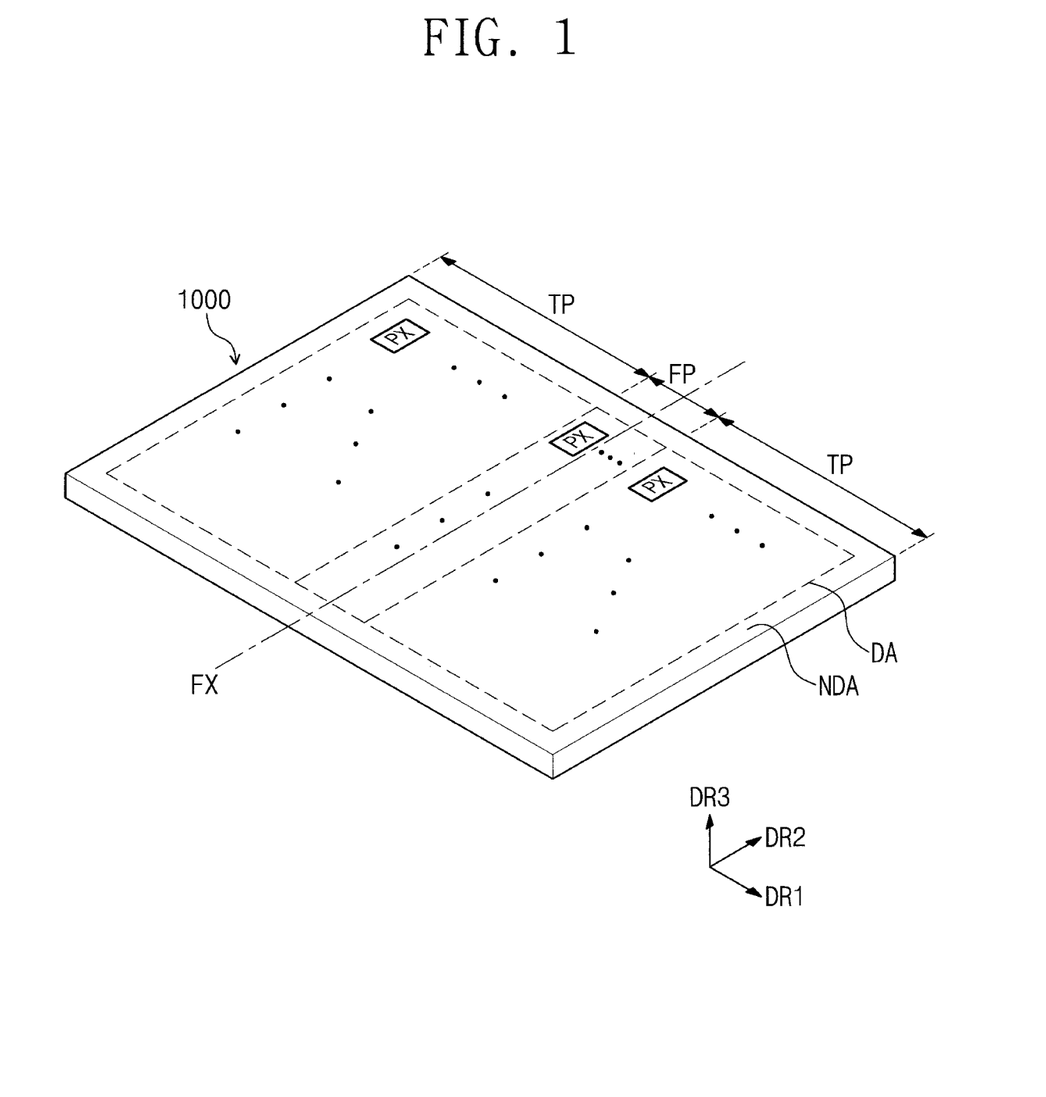
FIGS. 1-2 are perspective views of a display apparatus according to an exemplary embodiment of the inventive concept.
Figure 2:
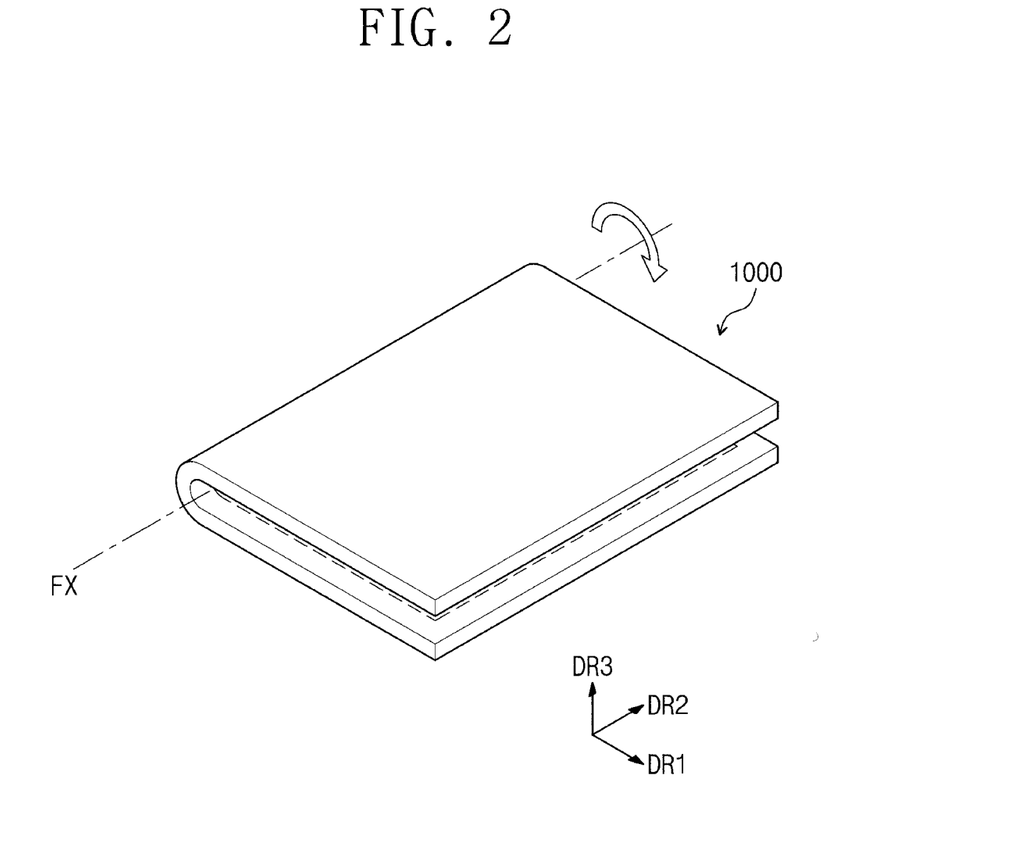

FIGS. 1 and 2 are perspective views of a display apparatus according to an embodiment of the inventive concept.

FIG. 1 illustrates a display apparatus 1000 in an unfolded state, and FIG. 2 illustrates the display apparatus 1000 in a folded state.

In some embodiments of the inventive concept, the display apparatus 1000 may be implemented in the form of a mobile terminal.

The display apparatus 1000 may be folded along a folding axis FX. On the display apparatus 1000, a folding region FP and a flat region TP may be defined. The folding region FP may be folded along the folding axis FX. The flat region TP may be connected to the folding region FP, and may maintain a flat shape in a folded state.

In an embodiment of the inventive concept, in the display apparatus 1000 in an unfolded state, the folding region FP and the flat region TP may be adjacent to each other in a first direction DR1. The folding axis FX may be extended in a second direction DR2 perpendicular to the first direction DR1. A third direction DR3 may be the thickness direction of the display apparatus 1000.

On the display apparatus 1000, a display region DA, and a non-display region NDA adjacent to the display region DA and not displaying an image may be defined. The non-display region NDA may be disposed at least one side of the display region DA. In FIG. 1, the non-display region NDA is exemplarily illustrated to surround the display region DA.

The folding region FP may overlap a portion of the display region DA, and may overlap a portion of the non-display region NDA.

On the display region DA, a plurality of pixels PX may be disposed. The pixels PX may be disposed on the folding region FP and the flat region TP that overlap the display region DA. Each of the pixels PX may display one color, such as red, green, blue, and white. The pixels PX may be arranged in a matrix form.

Figure 3:
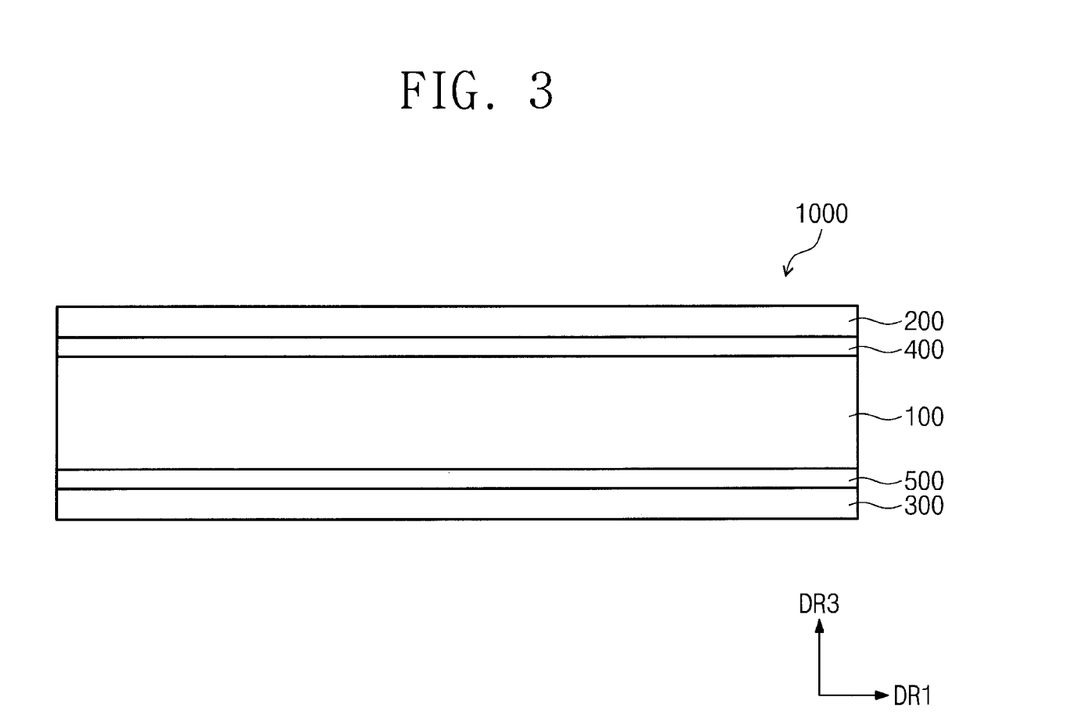
FIG. 3 is a cross-sectional view illustrating a display apparatus according to the embodiment of FIGS. 1 and 2.

FIG. 3 is a cross-sectional view illustrating a display apparatus according to the embodiments of FIGS. 1 and 2.

Referring to FIG. 3, the display apparatus 1000 may include a display panel 100, a window 200, a protection film 300, a first adhesive layer 400, and a second adhesive layer 500.

The display panel 100 displays an image. On the display panel 100, the folding region FP, the flat region TP, the display region DA, and the non-display region NDA of the display apparatus 1000 described with reference to FIGS. 1 and 2 may be defined.

The display panel 100 may be flexible. The display panel 100 may be implemented with various display panels. However, in an embodiment of the inventive concept, the display panel 100 is exemplarily illustrated to be an organic light emitting display panel.

The window 200 may be disposed on an upper portion of the display panel 100. The window 200 protects the display panel 100, and provides a surface on which an image is displayed on the outside as the outermost layer of the display apparatus 1000.

The window 200 may include a material having characteristics of being transparent or semi-transparent, and flexible, and may be composed of glass, plastic, or the like.

The protection film 300 may be disposed on a lower portion (e.g., bottom portion) of the display panel 100 to protect the display panel 100. Particularly, the protection film 300 may absorb an impact transferred to the lower portion of the display panel 100 to prevent or substantially prevent the display panel 100 and the window 200 from being damaged.

The first adhesive layer 400 is disposed between the display panel 100 and the window 200 to bond the display panel 100 and the window 200.

The second adhesive layer 500 is disposed between the display panel 100 and the protection film 300 to bond the display panel 100 and the protection film 300.

The protection film 300 may include a shear thickening fluid (STF). The shear thickening fluid may be present in a gel state usually. When an impact is applied to the shear thickening fluid, the distance between the fine nanoparticles dispersed in the fluid becomes closer, and the interaction between the nanoparticles is increased so that the fluid temporarily becomes stiff like a solid. When the stress applied to the shear thickening fluid is removed, the fluid returns to the original gel state thereof.

The protection film 300 may have a thickness of 300 um or less.

Due to the mechanism of a shear thickening fluid when an impact is applied thereto, the shear thickening fluid may exhibit an impact resistance characteristic. Also, when a relatively low shear stress is applied, the shear thickening fluid maintains a low viscosity so that the fluid has the same characteristics as a liquid, and may alleviate stress caused by bending.

Because the display apparatus 1000 according to an embodiment of the inventive concept may be folded on the basis of the folding axis FX, the protection film 300 may alleviate strain that may occur in the display panel 100 as the display panel 100 is folded.

Because a mobile terminal is typically carried by a user, it is more likely to be damaged. The impact resistance characteristic of a mobile terminal employing the display apparatus 1000, according to an embodiment of the inventive concept, may be improved (e.g., increased) thanks to the protection film 300 which temporarily becomes stiff when an impact equal to or greater than a reference value is applied thereto.

Figure 4:
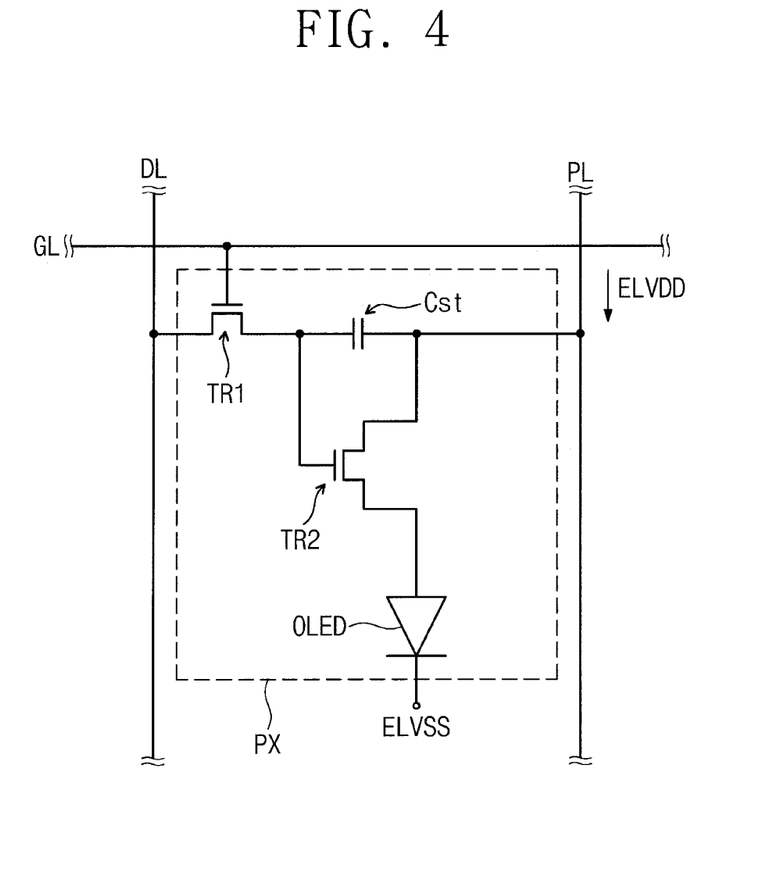
FIG. 4 is an equivalent circuit diagram of a pixel illustrated in FIG. 1.

FIG. 4 is an equivalent circuit diagram of a pixel illustrated in FIG. 1

Referring to FIGS. 3 and 4, the display panel 100 may further include a plurality of signal lines. In FIG. 4, any one scan line GL, any one data line DL, and a power line PL among the plurality of signal lines are illustrated, and the pixel PX connected to the scan line GL, the data line DL, and the power line PL is illustrated.

The pixel PX includes an organic light emitting diode OLED and a pixel driving circuit connected thereto. The pixel driving circuit may include a plurality of signal lines, a plurality of transistors, and a capacitor.

The organic light emitting diode OLED may be a front emission type light emitting diode, or a bottom emission type light emitting diode. The pixel PX includes a first transistor TR1 (or a switching transistor), a second transistor TR2 (or a driving transistor), and a capacitor Cst as a pixel driving circuit for driving the organic light emitting diode OLED. The power line PL provides a first power voltage ELVDD to the second transistor TR2, and provides a second power voltage ELVSS to the organic light emitting diode OLED. The second power voltage ELVSS may be a voltage lower than the first power voltage ELVDD.

The first transistor TR1 outputs a data signal applied to the data line DL in response to a scan signal applied to the scan line GL. The capacitor Cst charges a voltage corresponding to the data signal received from the first transistor TR1.

The second transistor TR2 is connected to the organic light emitting diode OLED. The second transistor TR2 controls a driving current flowing in the organic light emitting diode OLED in accordance with the amount of charge stored in the capacitor Cst. The organic light emitting diode OLED emits light during the turn-on period of the second transistor TR2.

In another embodiment of the inventive concept, a pixel driving circuit may be variously modified in a suitable manner, and a plurality of signal lines may further include lines receiving a various signals.

Figure 5:
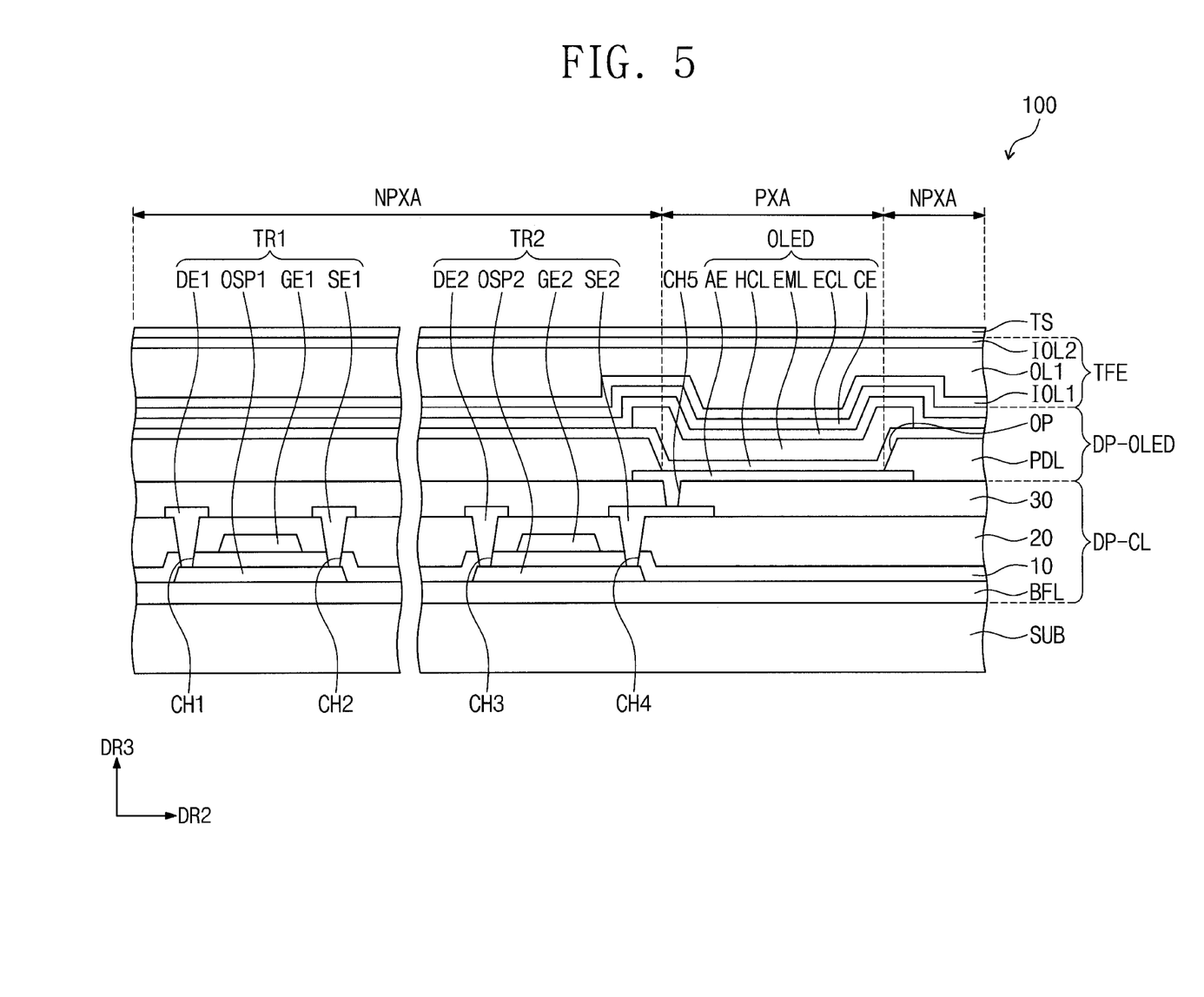
FIG. 5 is a cross-sectional view of a display panel corresponding to one pixel illustrated in FIG. 4.

FIG. 5 is a cross-sectional view of a display panel corresponding to one pixel illustrated in FIG. 4.

The display panel 100 includes a base layer SUB, a circuit element layer DP-CL, a display element layer DP-OLED, an encapsulation layer TFE, and a touch sensing unit TS, sequentially disposed thereon.

The circuit element layer DP-CL includes at least one inorganic film, at least one organic film, and a circuit element. The circuit element layer DP-CL includes a buffer film BFL which is an inorganic film, a first intermediate inorganic film 10, and a second intermediate inorganic film 20, and may include an intermediate organic film 30 which is an organic film.

The inorganic films may include silicon nitride, silicon oxynitride, silicon oxide, and the like. The organic film may include an acryl-based resin, a methacryl-based resin, polyisoprene, a vinyl-based resin, an epoxy-based resin, a urethane-based resin, a cellulose-based resin, a siloxane-based resin, a polyimide-based resin, a polyamide-based resin, a perylene-based resin, and/or the like. The circuit element includes conductive patterns and/or semiconductor patterns.

The buffer film BFL improves the bonding force between the base layer SUB and the conductive patterns or semiconductor patterns. A barrier layer for preventing foreign substances from entering, or reducing instances thereof, may further be disposed on an upper surface of the base layer SUB. The buffer film BFL and the barrier layer may selectively be disposed/omitted, as may be desired.

On the buffer film BFL, a semiconductor pattern OSP1 (hereinafter, a first semiconductor pattern) of the first transistor TR1, a semiconductor pattern OSP2 (hereinafter, a second semiconductor pattern) of the second transistor TR2 are disposed. The first semiconductor pattern OSP1 and the second semiconductor pattern OSP2 may be selected from amorphous silicon, polysilicon, and metal oxide semiconductors.

On the first semiconductor pattern OSP1 and the second semiconductor pattern OSP2, the first intermediate inorganic film 10 is disposed. On the first intermediate inorganic film 10, a control electrode GE1 (hereinafter, a first control electrode) of the first transistor TR1, and a control electrode GE2 (hereinafter, a second control electrode) of the second transistor TR2 are disposed. The first control electrode GE1, the second control electrode GE2 and the gate line GL may be formed by the same photolithography process.

On the first intermediate inorganic film 10, the second intermediate inorganic film 20 covering the first control electrode GE1 and the second control electrode GE2 is disposed. On the second intermediate inorganic film 20, an input electrode DE1 (hereinafter, a first input electrode and an output electrode SE1 (hereinafter, a first output electrode) of the first transistor TR1, and an input electrode DE2 (hereinafter, a second input electrode) and an output electrode SE2 (hereinafter, a second output electrode) of the second transistor TR2 are disposed.

The first input electrode DE1 and the first output electrode SE1 are each connected to the first semiconductor pattern OSP1 through a first through-hole CH1 and a second through-hole CH2 which pass through the first intermediate inorganic film 10 and the second intermediate inorganic film 20. The second input electrode DE2 and the second output electrode SE2 are each connected to the second semiconductor pattern OSP2 through a third through-hole CH3 and a fourth through-hole CH4 which pass through the first intermediate inorganic film 10 and the second intermediate inorganic film 20. In another embodiment of the inventive concept, some of the first transistor TR1 and the second transistor TR2 may be modified to have a bottom gate structure, and implemented.

On the second intermediate inorganic film 20, the intermediate organic film 30 covering the first input electrode DE1, the second input electrode DE2, the first output electrode SE1, and the second output electrode SE2 is disposed. The intermediate organic film 30 may provide a flat surface.

On the intermediate organic film 30, the display element layer DP-OLED is disposed. The display element layer DP-OLED may include a pixel defining layer PDL and the organic light emitting diode OLED. The pixel defining layer PDL may include an organic material such as the intermediate organic film 30. On the intermediate organic film 30, a first electrode AE is disposed. The first electrode AE is connected to the second output electrode SE2 through a fifth through-hole CH5 passing through the intermediate organic film 30. In the pixel defining layer PDL, an opening OP is defined. The opening OP of the pixel defining layer PDL exposes at least a portion of the first electrode AE.

The pixel PX may be disposed in a pixel region on a plane. The pixel region may include a light emitting region PXA, and a non-light emitting region NPXA adjacent to the light emitting region PXA. The non-light emitting region NPXA may surround the light emitting region PXA. In this embodiment, the light emitting region PXA is defined to correspond to a portion of the first electrode AE exposed by the opening OP.

A hole control layer HCL may be commonly disposed in the light emitting region PXA and the non-light emitting region NPXA. In some embodiments, a common layer such as the hole control layer HCL may be commonly formed in the plurality of pixels PX (see FIG. 3).

On the hole control layer HCL, a light emitting layer EML is disposed. The light emitting layer EML may be disposed in a region corresponding to the opening OP. That is, the light emitting layer EML may be divided and formed in each of the plurality of pixels PX. The light emitting layer EML may include an organic material and/or an inorganic material. In this embodiment, the light emitting layer EML which has been patterned is exemplarily illustrated. However, the light emitting layer EML may be commonly disposed in the plurality of pixels PX. At this time, the light emitting layer EML may generate red, green, blue, or white light, but is not limited to the color of light generated thereby. Also, the light emitting layer EML may have a multilayer structure.

On the light emitting layer EML, an electron control layer ECL is disposed. In some embodiments, the electron control layer ECL may be commonly formed in the plurality of pixels PX (see FIG. 3).

On the electron control layer ECL, a second electrode CE is disposed. The second electrode CE is commonly disposed in the plurality of pixels PX.

On the second electrode CE, the encapsulation layer TFE is disposed. The encapsulation layer TFE is commonly disposed in the plurality of pixels PX. In this embodiment, the encapsulation layer TFE directly covers the second electrode CE.

The encapsulation layer TFE may include at least one encapsulation inorganic film and at least one encapsulation organic film. The encapsulation inorganic film and the encapsulation organic film may be alternately laminated.

In this embodiment, the encapsulation layer TFE is exemplarily illustrated to include a first and second encapsulation inorganic film IOL1 and IOL2, and a first encapsulation organic film OL1.

The first encapsulation inorganic film IOL1, the first encapsulation organic film OL1, and the second encapsulation inorganic film IOL2 may be sequentially laminated on the second electrode CE.

The first encapsulation organic film OL1 may be formed using an inkjet printing method, or by coating a composition including an acryl-based monomer. The first and second encapsulation inorganic films IOL1 and IOL2 may have the same inorganic material, or may have different inorganic materials. Materials constituting the first and second encapsulation inorganic films IOL1 and IOL2 are not particularly limited, and may include silicon nitride, silicon oxynitride, silicon oxide, and/or the like.

In an embodiment of the inventive concept, between the encapsulation layer TFE and the second electrode CE, a capping layer for covering the second electrode CE may further be disposed. At this time, the encapsulation layer TFE may directly cover the capping layer.

The touch sensing unit TS obtains the coordinate information of an external input. The touch sensing unit TS may be directly disposed on the organic light emitting encapsulation layer TFE. As used herein, the term "directly disposed" excludes attaching using a separate adhesive layer, and means formed by a continuous process. However, embodiments of the inventive concept are not limited thereto, and the touch sensing unit TS may be attached on the encapsulation layer TFE through an adhesive layer.

The touch sensing unit TS may have a multilayer structure. The touch sensing unit TS may include a single-layered or a multi-layered conductive layer. The touch sensing unit TS may include a single-layered or a multi-layered insulation layer.

The touch sensing unit TS may sense an external input, for example, using an electrostatic capacity method. According to the inventive concept, an operation method of the touch sensing unit TS is not particularly limited. In an embodiment of the inventive concept, the touch sensing unit TS may sense an external input using an electromagnetic induction method or a pressure sensing method.

The display panel 100 may further include a reflection prevention layer on an upper portion of the touch sensing unit TS.

FIGS. 6 to 9 are cross-sectional views illustrating the protection film of FIG. 3 according to some embodiments of the inventive concept.

Figure 6:
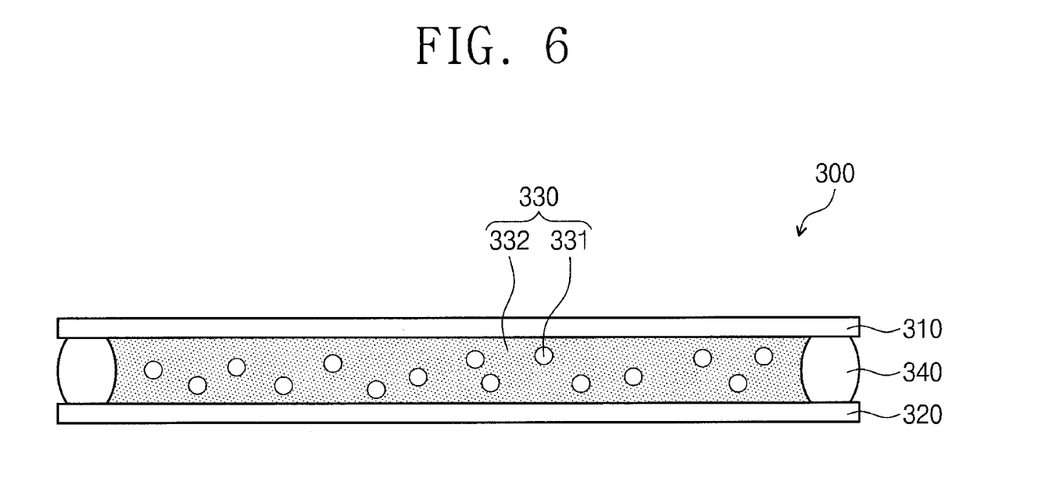
FIGS. 6-9 are cross-sectional views illustrating the protection film of FIG. 3 according to some exemplary embodiments of the inventive concept.

Referring to FIG. 6, the protection film 300 may include a first film 310, a second film 320, a shear thickening fluid 330, and a sealing member 340.

The first film 310 and the second film 320 may be disposed to face each other.

Each of the first film 310 and the second film 320 may use a polyester-based resin, such as polyethylene terephthalate, polyethylene isophthalate, polybutylene terephthalate, and/or the like; a cellulose-based resin, such as diacetylcellulose, triacetylcellulose, and/or the like; a polycarbonate-based resin; an acryl-based resin, such as polymethyl (meth) acrylate, polyethyl (meth) acrylate, and/or the like; a styrene-based resin, such as polystyrene, an acrylonitrile-styrene copolymer, and/or the like; a polyolefin-based resin, such as polyethylene, polypropylene, polyolefin resin having a cyclo-based or norbornene structure, an ethylene-propylene copolymer, and/or the like; a vinyl chloride resin; a polyamide-based resin, such as nylon, aromatic polyamide, and/or the like; an imide-based resin; a polyether sulfone-based resin; a sulfone-based resin; a polyether ketone-based resin: a polyphenylene sulfide-based resin; a vinyl alcohol-based resin; a vinylidene chloride-based resin; a vinyl butyral-based resin; an allylate-based resin; a polyoxymethylene-based resin; a film composed of a thermoplastic resin, such as an epoxy resin; and/or a film composed of a blend of thermoplastic resins. In addition, a film made of a thermosetting resin such as an (meth) acrylic-based resin, a urethane-based resin, an epoxy-based resin, or a silicone-based resin, a film made of an ultraviolet curable resin, and/or the like, may be used.

The shear thickening fluid 330 may include a dispersion fluid 332 for filling the gap between nanoparticles 331 and nanoparticles 331. The nanoparticles 331 may be, for example, silica particles, but are not limited thereto. The dispersion fluid 332 may be, for example, polyethylene glycol (PEG), or ethylen glycol (EG), but is not limited thereto.

The sealing member 340 may seal the gap between the first film 310 and the second film 320 to provide a sealed space therein. The shear thickening fluid 330 may be disposed in the space sealed by the sealing member 340.

Figure 7:
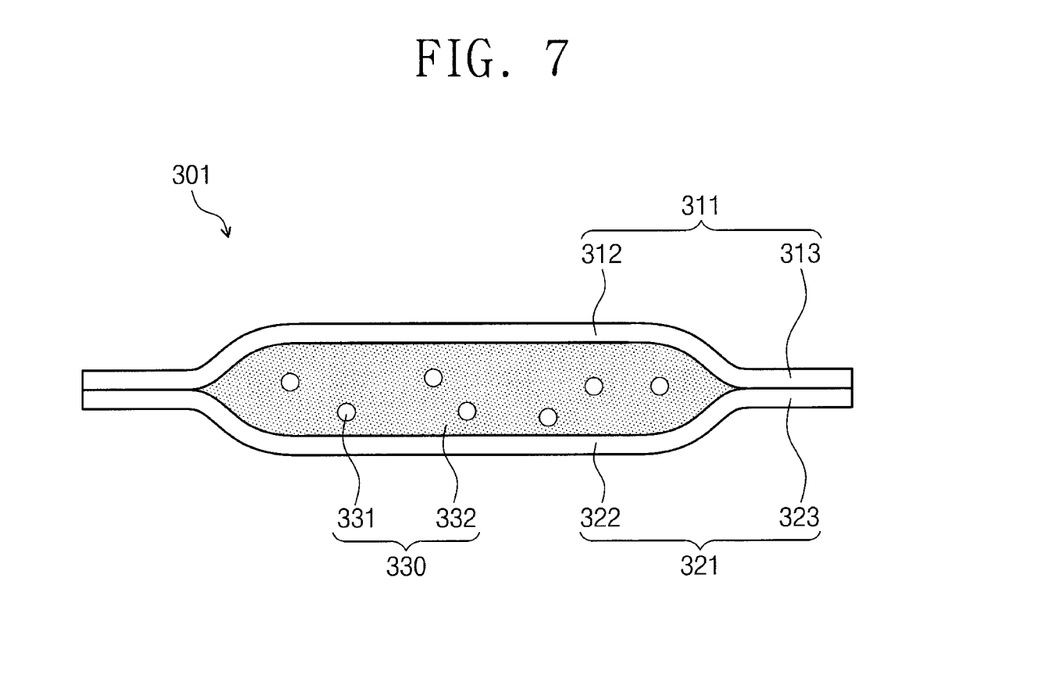

Referring to FIG. 7, a protection film 301 may include a first film 311, a second film 321, and the shear thickening fluid 330.

The first film 311 and the second film 321 may be composed of the same or substantially the same material as the first film 310 and the second film 320 described with reference to FIG. 6.

Materials composing the shear thickening fluid 330 were described with reference to FIG. 6, and therefore, a specific description thereof will not be repeated.

The first film 311 may include a first central portion 312, and a first peripheral portion 313 surrounding the first central portion 312.

The second film 321 may include a second central portion 322, and a second peripheral portion 323 surrounding the second central portion 322. The first central portion 312 and the second central portion 322 may face each other, and the first peripheral portion 313 and the second peripheral portion 323 may face each other.

The first peripheral portion 313 and the second peripheral portion 323 may be bonded to each other to provide a sealed space between the first central portion 312 and the second central portion 322. The first peripheral portion 313 and the second peripheral portion 323 may be bonded through, for example, a laser welding process.

The shear thickening fluid 330 may be disposed in the sealed space between the first central portion 312 and the second central portion 322.

Figure 8:
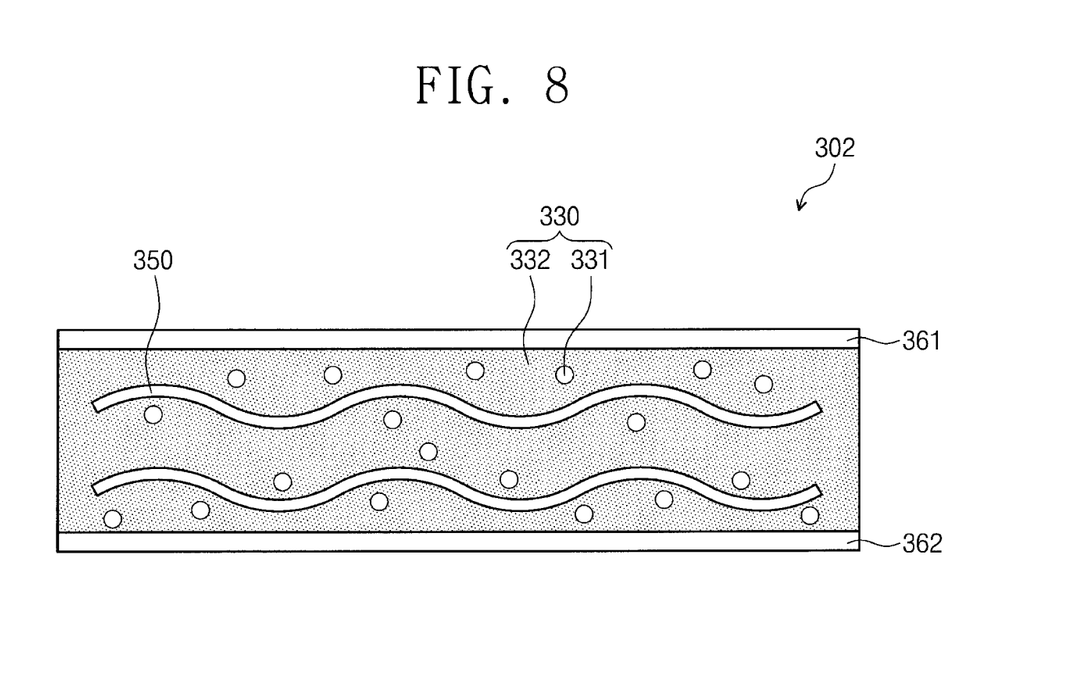

Referring to FIG. 8, a protection film 302 may include a fabric 350 and the shear thickening fluid 330.

The shear thickening fluid 330 may be impregnated into the fabric 350. Materials composing the shear thickening fluid 330 were described with reference to FIG. 6, and therefore, a specific description thereof will not be repeated.

The fabric 350 may be formed of various fibers, and may include, for example, a synthetic fiber, a carbon fiber, a glass fiber, and/or the like.

The protection film 302 may further include a first coating layer 361 and a second coating layer 362.

The first coating layer 361 may be disposed on an upper portion of the fabric 350 into which the shear thickening fluid 330 is impregnated.

The second coating layer 362 may be disposed on a lower portion of the fabric 350 into which the shear thickening fluid 330 is impregnated.

The first and second coating layers 361 and 362 may serve to protect the shear thickening fluid 330 from escaping from the fabric 350.

Figure 9:
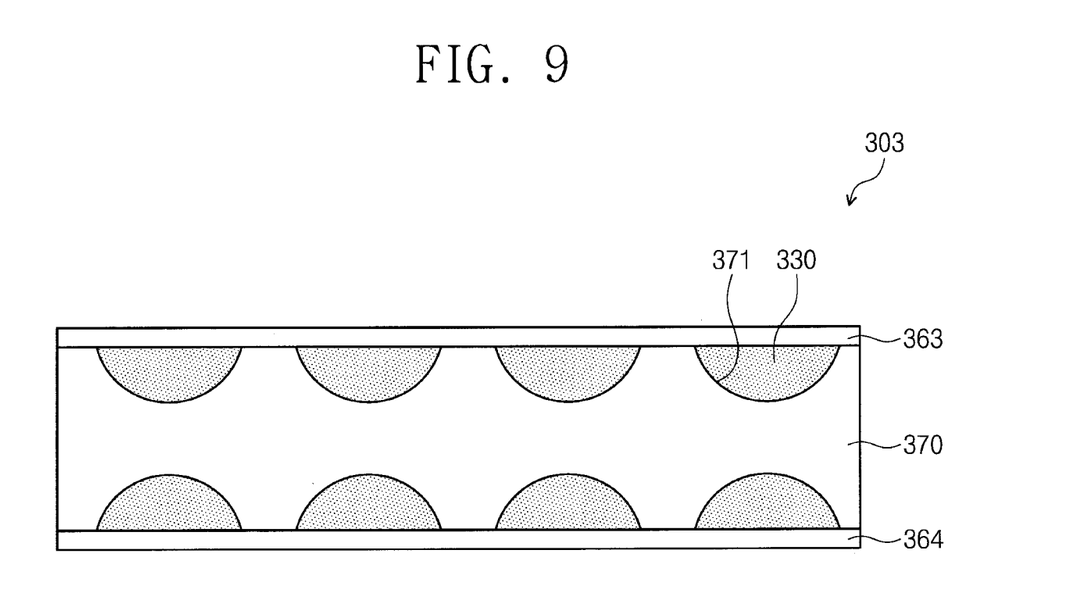

Referring to FIG. 9, a protection film 303 may include a base film 370 and the shear thickening fluid 330.

On a surface of the base film 370, a plurality of voids (e.g., pores) 371 may be defined. The voids 371 may be provided on an upper surface of the base film 370, and a lower surface thereof opposite the upper surface. In the voids 371 of the base film 370, the shear thickening fluid 330 may be disposed.

The protection film 303 may further include a first coating layer 363 and a second coating layer 364.

The first coating layer 363 may be disposed on an upper portion of the base film 370.

The second coating layer 364 may be disposed on a lower portion of the base film 370.

The first and second coating layers 363 and 364 may serve to protect the shear thickening fluid 330 from escaping from the voids 371 of the base film 370.

Figure 10A:
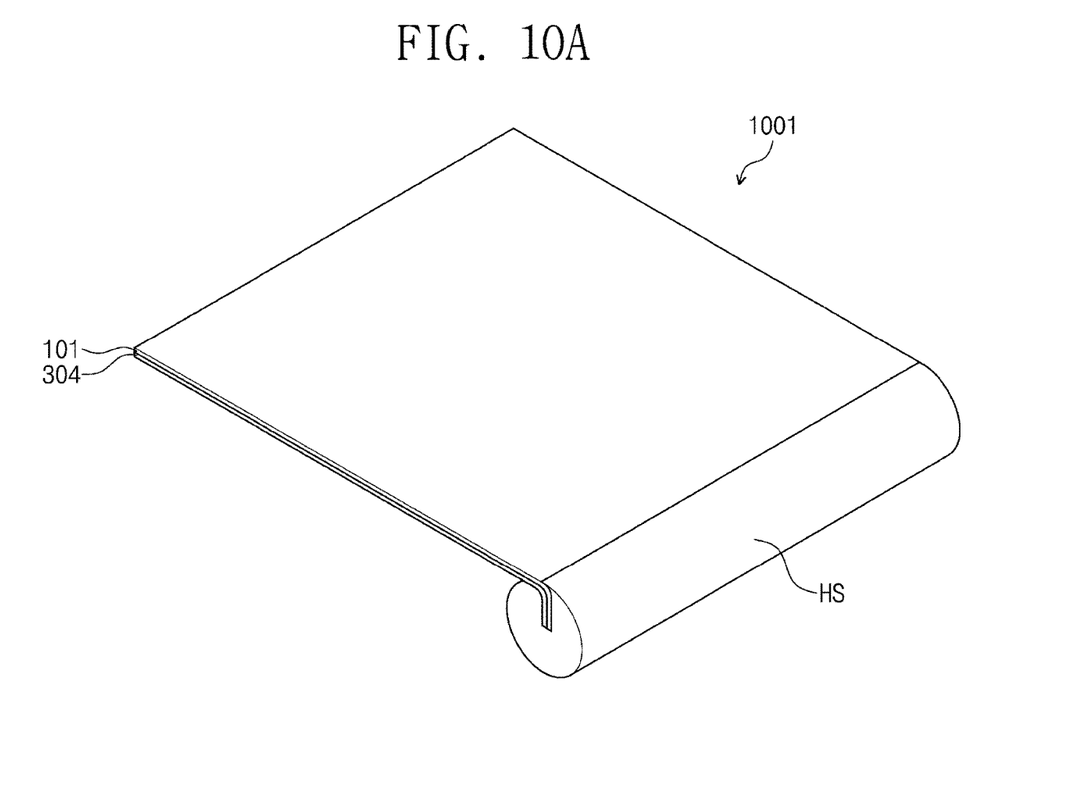
FIG. 10A is a perspective view illustrating a rollable display apparatus in an unrolled state, according to an exemplary embodiment of the inventive concept.
Figure 10B:
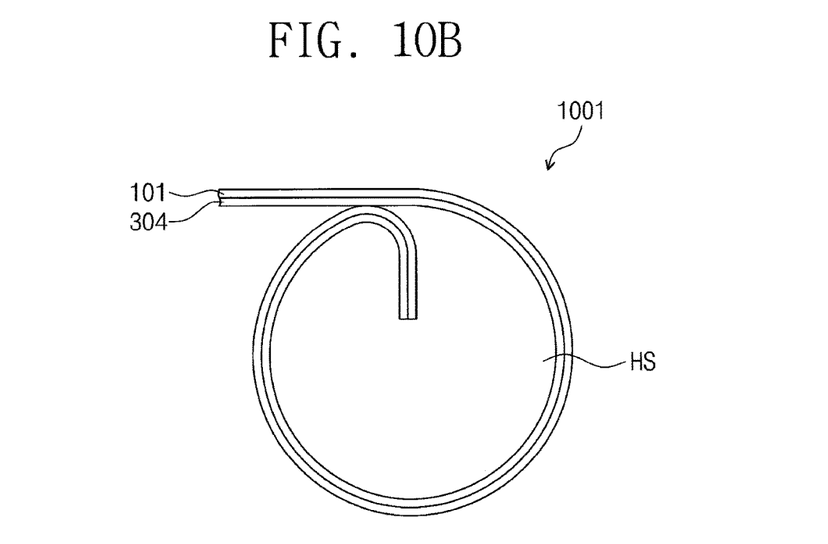
FIG. 10B is a perspective view illustrating a rollable display apparatus in a rolled state, according to an exemplary embodiment of the inventive concept.

FIG. 10A is a perspective view illustrating a rollable display apparatus 1001 in an unrolled state, and FIG. 10B is a perspective view illustrating the rollable display apparatus 1001 in a rolled state.

Referring to FIGS. 10A and 10B, the rollable display apparatus 1001 may include a housing HS, a display panel 101, and a protection film 304.

In some embodiments, the housing HS functions as a winding core for rolling the display panel 101. The housing HS may have an approximate cylindrical shape.

The protection film 304 may be bonded to a lower portion of the display panel 101. The display panel 101 may be flexible. The display panel 101 may be the display panel 100 described with reference to FIGS. 3 to 5, and the protection film 304 may be one of the protection films 300 to 303 described with reference to FIGS. 6 to 9. The display panel 101 having the protection film 304 bonded thereto may be fixed inside the housing HS.

The rollable display apparatus 1001 may be operated in a rolled state and in an unrolled state. In a rolled state, the display panel 101 having the protection film 304 bonded thereto may be rolled along the outer circumference of the housing HS. In an unrolled state, the display panel 101 having the protection film 304 bonded thereto may be unwound and unrolled in the direction opposite to the rolling direction.

In the rollable display apparatus 1001 described with reference to FIGS. 10A and 10B, the protection film 304 may alleviate strain which may occur in the display panel 101 as the display panel 101 is rolled. Also, the impact resistance characteristic of the rollable display apparatus 1001 may be improved thanks to the protection film 304, which temporarily becomes stiff when an impact equal to or greater than a reference value is applied thereto.

Figure 11A:
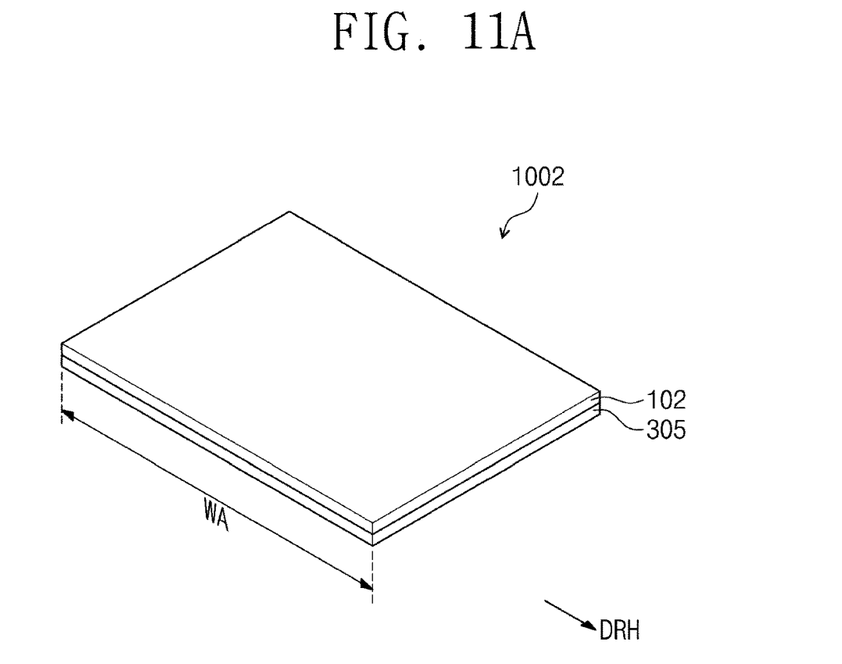
FIG. 11A is a perspective view illustrating a stretchable display apparatus in an initial state, according to an exemplary embodiment of the inventive concept.
Figure 11B:
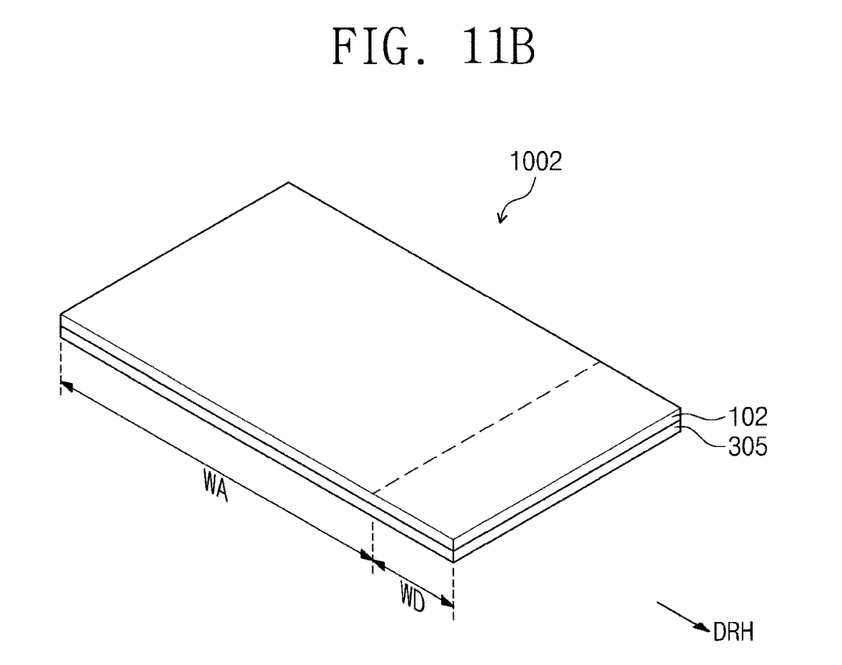
FIG. 11B is a perspective view illustrating a stretchable display apparatus in a stretched state, according to an exemplary embodiment of the inventive concept.

FIG. 11A is a perspective view illustrating a stretchable display apparatus 1002 in an initial state, and FIG. 11B is a perspective view illustrating the stretchable display apparatus 1002 in a stretched state.

Referring to FIGS. 11A and 11B, the stretchable display apparatus 1002 may include a display panel 102 and the protection film 304.

The display panel 102 may be stretched by an external force. When the external force is removed from the display panel 102, the original state thereof may be restored. Here, the term "stretched" means that a length or an area is extended when viewed from a plane, which is different from being folded or bent in one direction.

The stretchable display apparatus 1002 in an initial state of FIG. 11 is exemplarily illustrated to have a first length WA in a horizontal direction DRH. The stretchable display apparatus 1002 in a stretched state of FIG. 11B is exemplarily illustrated to be extended by a length (e.g., predetermined length) WD in the horizontal direction DRH compared with the stretchable display apparatus 1002 in an initial state of FIG. 11A.

The protection film 305 may be any one of the protection films 300 to 303 described with reference to FIGS. 6 to 9. The protection film 305 is disposed on a lower portion of the display panel 102 to be stretched or restored as the display panel 102 is stretched or restored.

In the stretchable display apparatus 1002 described with reference to FIGS. 11A and 11B, the protection film 305 may alleviate strain which may occur in the display panel 102 as the display panel 102 is stretched. Also, the impact resistance characteristic of the stretchable display apparatus 1002 may be improved (e.g., increased) thanks to the protection film 305, which temporarily becomes stiff when an impact equal to or greater than a reference value is applied thereto.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A display apparatus comprising:
   a display panel having a display region on which an image is displayed, a non-display region adjacent to the display region, a folding region configured to be folded along a folding axis and overlapping the display region, and a flat region adjacent to the folding region and extending in a direction perpendicular to the folding axis; and
   a protection film on a lower portion of the display panel and comprising a shear thickening fluid, the shear thickening fluid comprising nanoparticles and dispersion fluid between the nanoparticles.

2. The display apparatus of claim 1, wherein the protection film further comprises:
   a first film;
   a second film separated from the first film; and
   a sealing member configured to seal a gap between the first film and the second film to provide a sealed space therein, and
   wherein the shear thickening fluid is in the sealed space.

3. The display apparatus of claim 1, wherein the protection film further comprises:
   a first film comprising a first central portion, and a first peripheral portion surrounding the first central portion; and
   a second film comprising a second central portion opposite from the first central portion, and a second peripheral portion surrounding the second central portion and opposite from the first peripheral portion, and
   wherein the first peripheral portion and the second peripheral portion are bonded to each other to provide a sealed space between the first central portion and the second central portion, and the shear thickening fluid is in the sealed space.

4. The display apparatus of claim 1, wherein the protection film further comprises a fabric, and the shear thickening fluid is impregnated into the fabric.

5. The display apparatus of claim 4, wherein the protection film further comprises:
   a first coating layer on an upper portion of the fabric into which the shear thickening fluid is impregnated; and a second coating layer on a lower portion of the fabric into which the shear thickening fluid is impregnated.

6. The display apparatus of claim 1, wherein the protection film further comprises a base film having a void defined on a surface thereof, and the shear thickening fluid is in the void of the base film.

7. The display apparatus of claim 6, wherein the protection film further comprises:
a first coating layer on an upper portion of the base film; and
a second coating layer on a lower portion of the base film.

8. The display apparatus of claim 1, further comprising an adhesive layer between the display panel and the protection film.

9. The display apparatus of claim 1, wherein the display panel is an organic light emitting display panel.

10. The display apparatus of claim 1, further comprising:
a window on an upper portion of the display panel; and
an adhesive layer between the window and the display panel.

11. The display apparatus of claim 1, wherein the protection film has a thickness of 300 μm or less.

12. A display apparatus comprising:
a flexible display panel having a display region on which an image is displayed, and a non-display region adjacent to the display region; and
a protection film on a lower portion of the display panel and comprising a shear thickening fluid, the shear thickening fluid comprising nanoparticles and dispersion fluid between the nanoparticles.

13. The display apparatus of claim 12, wherein the display panel is an organic light emitting display panel.

14. The display apparatus of claim 12, further comprising a housing configured to allow the display panel to be rolled along an outer periphery thereof, wherein the display panel is flexible.

15. The display apparatus of claim 12, wherein the display panel is stretchable.

16. A mobile terminal comprising:
a display panel having a display region on which an image is displayed, a non-display region adjacent to the display region, a folding region configured to be folded along a folding axis and overlapping the display region, and a flat region defined adjacent to the folding region in a direction perpendicular to the folding axis, the display region, the non-display region, the folding region and the flat region being defined on the display panel; and
a protection film on a lower portion of the display panel and comprising a shear thickening fluid, the shear thickening fluid comprising nanoparticles and dispersion fluid between the nanoparticles.

17. The mobile terminal of claim 16, wherein the protection film further comprises:
a first film;
a second film separated from the first film; and
a sealing member configured to seal a gap between the first film and the second film to provide a sealed space therein, wherein the shear thickening fluid is in the sealed space.

18. The mobile terminal of claim 16, wherein the protection film further comprises:
a first film comprising a first central portion, and a first peripheral portion surrounding the first central portion; and
a second film comprising a second central portion opposite from the first central portion, and a second peripheral portion surrounding the second central portion and opposite from the first peripheral portion, and
wherein the first peripheral portion and the second peripheral portion are bonded to each other to provide a sealed space between the first central portion and the second central portion, and the shear thickening fluid is in the sealed space.

19. The mobile terminal of claim 16, wherein the protection film further comprises a fabric, and the shear thickening fluid is impregnated into the fabric.

20. The mobile terminal of claim 16, wherein the protection film further comprises a base film having a void defined on a surface thereof, and the shear thickening fluid is in the void of the base film.

* * * * *